(12) United States Patent
Xu et al.

(10) Patent No.: US 11,372,057 B2
(45) Date of Patent: Jun. 28, 2022

(54) FLEXIBLE FLAT CABLE TESTING SYSTEM

(71) Applicants: Tyco Electronics (Shanghai) Co. Ltd., Shanghai (CN); TE Connectivity Corporation, Berwyn, PA (US)

(72) Inventors: Zhonghua Xu, Shanghai (CN); Dandan Zhang, Shanghai (CN); Roberto Francisco-Yi Lu, Bellevue, WA (US); Yingcong Deng, Shanghai (CN); Zongjie Tao, Shanghai (CN)

(73) Assignees: Tyco Electronics (Shanghai) Co. Ltd., Shanghai (CN); TE Connectivity Corporation, Berwyn, PA (US)

( * ) Notice: Subject to any disclaimer, the term of this patent is extended or adjusted under 35 U.S.C. 154(b) by 0 days.

(21) Appl. No.: 16/999,438

(22) Filed: Aug. 21, 2020

(65) Prior Publication Data
US 2021/0055358 A1 Feb. 25, 2021

(30) Foreign Application Priority Data
Aug. 21, 2019 (CN) .......................... 201910775374.3

(51) Int. Cl.
*G01R 31/52* (2020.01)
*G01R 31/58* (2020.01)
*H01B 7/08* (2006.01)

(52) U.S. Cl.
CPC ............. *G01R 31/58* (2020.01); *G01R 31/52* (2020.01); *H01B 7/08* (2013.01)

(58) Field of Classification Search
CPC . G01R 31/50; G01R 31/52; H01B 7/08–0892
See application file for complete search history.

(56) References Cited

U.S. PATENT DOCUMENTS

| | | | | | |
|---|---|---|---|---|---|
| 3,549,995 | A | * | 12/1970 | Teska | G01R 31/67 324/73.1 |
| 4,042,878 | A | * | 8/1977 | Peterson | G01R 31/58 324/556 |
| 4,285,118 | A | * | 8/1981 | Peppier | G01R 31/58 29/593 |

(Continued)

FOREIGN PATENT DOCUMENTS

| | | | | | |
|---|---|---|---|---|---|
| CN | 1920586 | A | * | 2/2007 | ............. G01R 31/52 |
| CN | 100529779 | C | * | 8/2009 | ............. G01R 31/52 |

(Continued)

*Primary Examiner* — Patrick Assouad
*Assistant Examiner* — Demetrius R Pretlow
(74) *Attorney, Agent, or Firm* — Barley Snyder

(57) ABSTRACT

A flexible flat cable testing system includes a first connector including a row of first contacts electrically contacting first ends of a row of wires of a flexible flat cable, a second connector including a row of second contacts electrically contacting second ends of the row of wires, a short circuit test unit including output ports electrically connected to the row of first contacts and input ports electrically connected to the row of second contacts, a potential reader reading a potential level of each of the input ports, and a judgment unit determining whether or not a quality of the flexible flat cable is qualified according to the potential level of each of the input ports. The judgment unit determines that the quality of the flexible flat cable is qualified if the potential level of each of the input ports is equal to a high level output by each of the output ports.

20 Claims, 4 Drawing Sheets

(56) References Cited

U.S. PATENT DOCUMENTS

| | | | | | |
|---|---|---|---|---|---|
| 4,445,086 | A | * | 4/1984 | Bulatao | G01R 31/60 324/66 |
| 5,247,259 | A | * | 9/1993 | Miller | G01R 31/58 324/540 |
| 5,436,554 | A | * | 7/1995 | Decker, Jr. | G01R 31/52 324/66 |
| 2008/0020627 | A1 | * | 1/2008 | Sexton | H02H 3/38 439/404 |
| 2009/0189625 | A1 | * | 7/2009 | Taunton | G01R 31/50 324/750.01 |
| 2009/0201027 | A1 | * | 8/2009 | Sexton | H02H 11/002 324/527 |
| 2012/0299598 | A1 | * | 11/2012 | Alley | G01R 31/52 324/509 |
| 2012/0303297 | A1 | * | 11/2012 | Alley | G01R 31/50 702/58 |
| 2018/0345886 | A1 | * | 12/2018 | Tazarine | B60L 3/0069 |

FOREIGN PATENT DOCUMENTS

| | | | | | |
|---|---|---|---|---|---|
| CN | 106249094 | A | * | 12/2016 | |
| CN | 107167699 | A | * | 9/2017 | G01R 31/52 |
| CN | 108919001 | A | * | 11/2018 | |
| CN | 111948427 | A | * | 11/2020 | |
| CN | 111965563 | A | * | 11/2020 | G01R 31/54 |
| DE | 10324919 | A1 | * | 1/2004 | H01B 7/08 |
| EP | 2546666 | A2 | * | 1/2013 | G01R 31/52 |
| JP | 57207874 | A | * | 12/1982 | G01R 31/54 |
| JP | 2007147474 | A | * | 6/2007 | |
| KR | 20060019779 | A | * | 3/2006 | |

* cited by examiner

FLEXIBLE FLAT CABLE TESTING SYSTEM

CROSS-REFERENCE TO RELATED APPLICATION

This application claims the benefit of the filing date under 35 U.S.C. § 119(a)-(d) of Chinese Patent Application No. 201910775374.3, filed on Aug. 21, 2019.

FIELD OF THE INVENTION

The present invention relates to a testing system and, more particularly, to a flexible flat cable testing system.

BACKGROUND

A flexible flat cable usually comprises a row of wires and an insulator wrapped around the row of wires. Both ends of the row of wires are exposed from both sides of the insulator. In the prior art, the flexible flat cables with the same length or different length are usually obtained by cutting a flexible flat cable strip.

The wires in the flexible flat cable may be broken. Therefore, it is necessary to test the wires in the flexible flat cable to determine whether the wires in the flexible flat cable have a quality defect. If one of the wires is broken, the quality of the flexible flat cable is unqualified, and it will be discarded as a waste product. In order to test whether the wires in the flexible flat cable have the quality defect, workers need to test each wire in the flexible flat cable with a multimeter, which results in very low test efficiency.

SUMMARY

A flexible flat cable testing system includes a first connector including a row of first contacts electrically contacting first ends of a row of wires of a flexible flat cable, a second connector including a row of second contacts electrically contacting second ends of the row of wires, a short circuit test unit including output ports electrically connected to the row of first contacts and input ports electrically connected to the row of second contacts, a potential reader reading a potential level of each of the input ports, and a judgment unit determining whether or not a quality of the flexible flat cable is qualified according to the potential level of each of the input ports. The judgment unit determines that the quality of the flexible flat cable is qualified if the potential level of each of the input ports is equal to a high level output by each of the output ports.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF THE EMBODIMENT(S)

Figure 1:
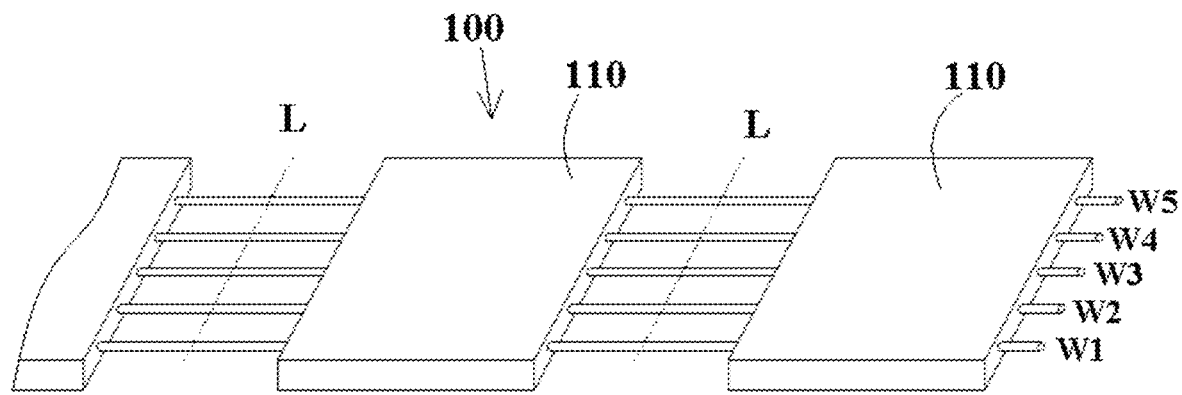
FIG. 1 is a perspective view of a flat flexible cable according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

As shown in FIG. 1, in an embodiment, in a production line of a flexible flat cable, a flexible flat cable 100 with a predetermined length may be obtained by cutting off a row of wires W1, W2, ..., W5 along dash lines L illustrated in FIG. 1. Each flexible flat cable 100 comprises a row of wires W1, W2, ..., W5 and an insulator 110 wrapped on the row of wires W1, W2, ..., W5. Both ends of the row of wires W1, W2, ..., W5 are exposed from both sides of the insulator 110.

As shown in FIGS. 2-5, in an embodiment, a flexible flat cable test system comprises a first connector 10, a second connector 20, a short circuit test unit 30, a potential reader 31, and a judgment unit 32.

Figure 2:
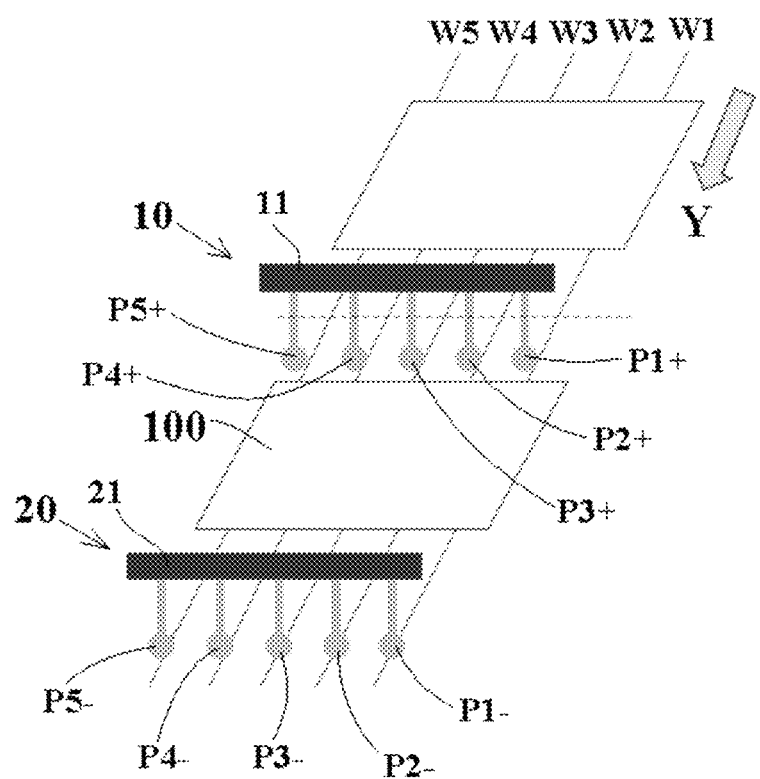
FIG. 2 is a schematic diagram of a flat flexible cable test system according to an embodiment.
Figure 3:
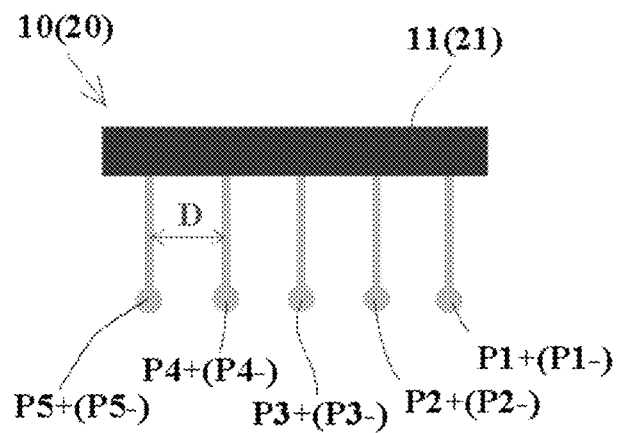
FIG. 3 is a schematic diagram of a first connector and a second connector of the flat flexible cable test system.

The first connector 10, as shown in FIGS. 2 and 3, includes a row of first contacts P1+, P2+, ..., P5+. The row of first contacts P1+, P2+, ..., P5+ are configured to electrically contact with first ends of the row of wires W1, W2, ..., W5 of a flexible flat cable 100, respectively.

The second connector 20, as shown in FIGS. 2 and 3, includes a row of second contacts P1−, P2−, ..., P5−. The row of second contacts P1−, P2−, ..., P5− are configured to electrically contact with second ends of the row of wires W1, W2, ..., W5 of the flexible flat cable 100, respectively.

Figure 4:
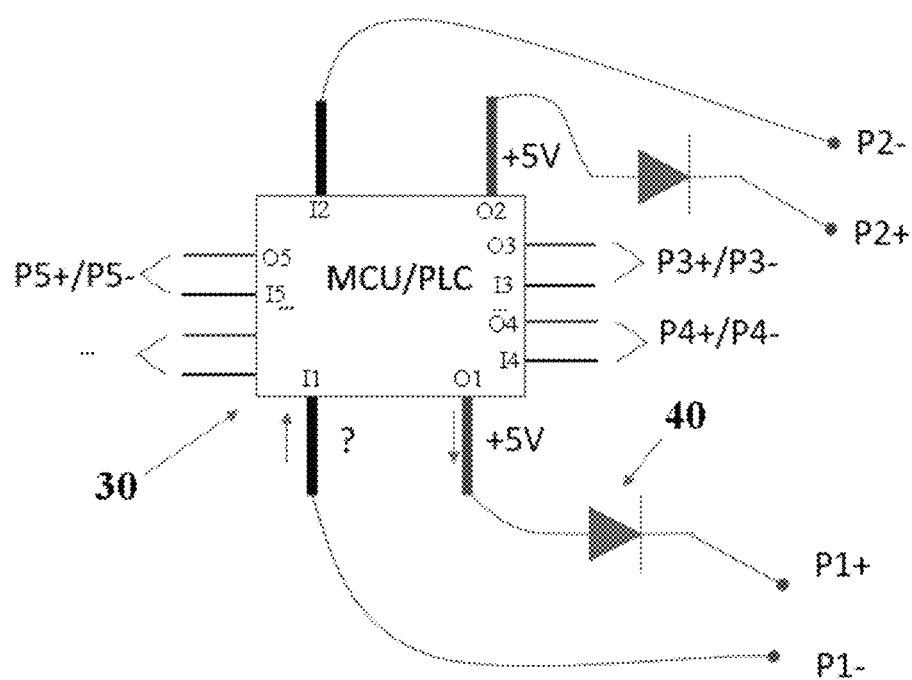
FIG. 4 is a schematic diagram of a short circuit test unit of a flat flexible cable test system according to an embodiment.
Figure 5:
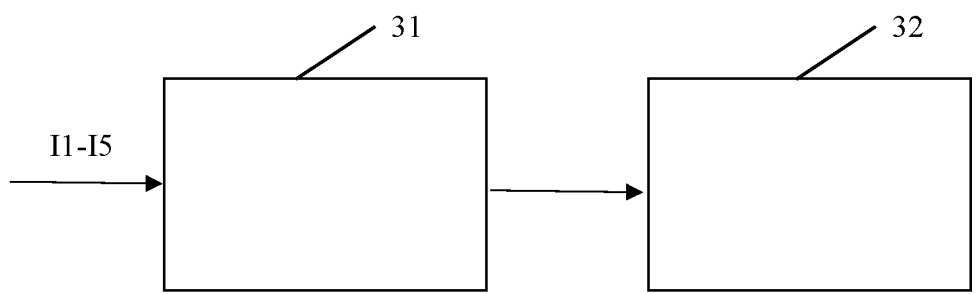
FIG. 5 is a schematic diagram of a potential reader and a judgment unit according to an embodiment.

The short circuit test unit 30, as shown in FIG. 4, includes a plurality of output ports O1, O2, ..., O5 and a plurality of input ports I1, I2, ..., I5. For example, the plurality of output ports O1, O2, ..., O5 are each configured to output a high level (for example, a high level of +5V) and are electrically connected to the row of first contacts P1+, P2+, ..., P5+, respectively. The plurality of input ports I1, I2, ..., I5 are electrically connected to the row of second contacts P1−, P2−, ..., P5−, respectively. In the shown embodiment, the short circuit test unit 30 may be a micro controller unit (MCU) or a programmable logic controller (PLC). The micro controller unit or the programmable logic controller has the plurality of output ports O1, O2, ..., O5 and the plurality of input ports I1, I2, ..., I5.

In an embodiment, the potential reader 31 is configured to read a potential level of each input port I1, I2, ..., I5 of the short circuit testing unit 30. For example, the potential reader 31 may be or include a voltmeter or multimeter.

In an embodiment, the judgment unit 32 is configured to determine whether or not the quality of the flexible flat cable 100 is qualified according to the potential level read from respective input ports I1, I2, . . . , I5. For example, the judgment unit 32 may be or include a processor or CPU.

When each of the plurality of output ports O1, O2, . . . , O5 outputs a high level, the judgment unit 32 determines that the quality of the flexible flat cable 100 is qualified if the potential level read from each input port I1, I2, . . . , I5 is equal to the high level. In this case, if the quality of the flexible flat cable 100 is qualified, the input ports I1, I2, . . . , I5 of the short circuit test unit 30 are shorted to the output ports O1, O2, . . . , O5 via the row of wires W1, W2, . . . , W5 of the flexible flat cable 100, respectively, so that the input ports I1, I2, . . . , I5 and the output ports O1, O2, . . . , O5 of the short circuit test unit 30 have the same potential level, for example, have the same high level.

When the potential levels read from the input ports I1, I2, . . . , I5 are not all high levels, the judgment unit 32 determines that the quality of the flexible flat cable 100 is unqualified. In this case, it may determine that at least one input port I1, I2, . . . , I5 is not shorted to the corresponding output port O1, O2, . . . , O5, and thus it may determine that at least one of the wires W1, W2, . . . , W5 of the flexible flat cable 100 is broken. When the potential level read from the nth (n is a positive integer) input port In of the input ports I1, I2, . . . , I5 is a low level, the judgment unit 32 determines that the nth wire Wn corresponding to the nth input port In of the flexible flat cable 100 is broken and unqualified. When the potential level read from the nth input port In of the input ports I1, I2, . . . , I5 is the high level, the judgment unit 32 determines that the nth wire Wn corresponding to the nth input port In of the flexible flat cable 100 is continuous (that is, not broken) and qualified.

As shown in FIG. 4, in an embodiment, each output port O1, O2, . . . , O5 of the short circuit test unit 30 is electrically connected to the corresponding first contact P1+, P2+, . . . , P5+ via a diode 40. A positive end of the diode 40 is electrically connected to the corresponding output port O1, O2, . . . , O5, and the negative end of the diode 40 is electrically connected to the corresponding first contact P1+, P2+, . . . , P5+. In this way, the diodes 40 may prevent the output ports O1, O2, . . . , O5 of the short circuit test unit 30 from being broken down by a reverse voltage.

As shown in FIGS. 2-3, in an embodiment, the first connector 10 includes a first insulator 11, and the row of first contacts P1+, P2+, . . . , P5+ is installed on the first insulator 11 and extends outwards from one side of the first insulator 11, so that the first connector 10 is in the shape of a comb. In an embodiment, the row of first contacts P1+, P2+, . . . , P5+ is movably installed on the first insulator 11, so that a distance D between two adjacent first contacts P1+, P2+, . . . , P5+ is capable of being adjusted by moving the first contacts P1+, P2+, . . . , P5+. Thereby, the distance D between two adjacent first contacts P1+, P2+, . . . , P5+ may be adjusted to be equal to a pitch between two adjacent wires W1, W2, . . . , W5 of the flexible flat cable 100 to be tested.

As shown in FIGS. 2-3, in an embodiment, the second connector 20 includes a second insulator 21, and the row of second contacts P1−, P2−, . . . , P5− is installed on the second insulator 21 and extends outwards from one side of the second insulator 21, so that the second connector 20 is in the shape of a comb. The row of second contacts P1−, P2−, . . . , P5− is movably installed on the second insulator 21, so that a distance D between two adjacent second contacts P1−, P2−, . . . , P5− is capable of being adjusted by moving the second contacts P1−, P2−, . . . , P5−. Thereby, the distance D between two adjacent second contacts P1−, P2−, . . . , P5− may be adjusted to be equal to a pitch between two adjacent wires W1, W2, . . . , W5 of the flexible flat cable 100 to be tested.

As shown in FIG. 2, in an embodiment, the flexible flat cable test system is arranged on a production line of the flexible flat cable 100, and is used for on-line detection of the quality of the flexible flat cable 100.

The flexible flat cable test system, in an embodiment, further comprises a moving device (not shown) for moving the first connector 10 and the second connector 20. After the flexible flat cable 100 to be tested is delivered to a test station, the first connector 10 and the second connector 20 are moved to a first contact position and a second contact position, respectively, by the moving device, as shown in FIG. 3. When the first connector 10 is moved to the first contact position, the first connector 10 electrically contacts with one ends of the row of wires W1, W2, . . . , W5 of the flexible flat cable 100. When the second connector 20 is moved to the second contact position, the second connector 20 electrically contacts with the other ends of the row of wires W1, W2, . . . , W5 of the flexible flat cable 100. The moving device is adapted to move the first connector 10 and the second connector 20 in a transverse direction (a width direction of the flexible flat cable 100) perpendicular to a conveying direction (a length direction of the flexible flat cable 100) Y of the flexible flat cable 100 and a vertical direction (a thickness direction of the flexible flat cable 100) perpendicular to the conveying direction Y and the transverse direction.

In various exemplary embodiments of the present disclosure, the flexible flat cable test system may test all wires W1, W2, . . . , W5 in the flexible flat cable 100 simultaneously, thus improving the test efficiency of the flexible flat cable 100.

It should be appreciated for those skilled in this art that the above embodiments are intended to be illustrative, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A flexible flat cable testing system, comprising:
a first connector including a row of first contacts electrically contacting a plurality of first ends of a row of wires of a flexible flat cable;
a second connector including a row of second contacts electrically contacting a plurality of second ends of the row of wires of the flexible flat cable;

a short circuit test unit including a plurality of output ports electrically connected to the row of first contacts and a plurality of input ports electrically connected to the row of second contacts;

a potential reader configured to read a potential level of each of the plurality of input ports; and a judgment unit configured to determine whether or not a quality of the flexible flat cable is qualified according to the potential level of each of the input ports, the judgment unit determines that the quality of the flexible flat cable is qualified if the potential level of each of the input ports is equal to a high level output by each of the output ports.

2. The flexible flat cable testing system according to claim 1, wherein, if the potential levels of the input ports are not all the high level, the judgment unit determines that the quality of the flexible flat cable is unqualified.

3. The flexible flat cable testing system according to claim 1, wherein, if the potential level of one input port of the input ports is a low level, the judgment unit determines that a wire corresponding to the one input port in the flexible flat cable is broken and unqualified.

4. The flexible flat cable testing system according to claim 3, wherein, if the potential level of the one input port of the input ports is the high level, the judgment unit determines that the wire corresponding to the one input port in the flexible flat cable is continuous and qualified.

5. The flexible flat cable testing system according to claim 2, wherein, if the potential level of one input port of the input ports is a low level, the judgment unit determines that a wire corresponding to the one input port in the flexible flat cable is broken and unqualified.

6. The flexible flat cable testing system according to claim 5, wherein, if the potential level of the one input port of the input ports is the high level, the judgment unit determines that the wire corresponding to the one input port in the flexible flat cable is continuous and qualified.

7. The flexible flat cable testing system according to claim 1, wherein each of the output ports is electrically connected to one of the first contacts via a diode.

8. The flexible flat cable testing system according to claim 7, wherein a positive end of the diode is electrically connected to one of the output ports and a negative end of the diode is electrically connected to one of the first contacts.

9. The flexible flat cable testing system according to claim 1, wherein the first connector has a first insulator, the row of first contacts is installed on the first insulator and extends outwards from a side of the first insulator.

10. The flexible flat cable testing system according to claim 9, wherein the first connector is in a shape of a comb.

11. The flexible flat cable testing system according to claim 10, wherein the row of first contacts is movably installed on the first insulator and a distance between two adjacent first contacts is adjustable be equal to a pitch between two adjacent wires of the flexible flat cable.

12. The flexible flat cable testing system according to claim 9, wherein the second connector has a second insulator, the row of second contacts is installed on the second insulator and extends outwards from a side of the second insulator.

13. The flexible flat cable testing system according to claim 12, wherein the second connector is in a shape of a comb.

14. The flexible flat cable testing system according to claim 12, the row of second contacts is movably installed on the second insulator and a distance between two adjacent second contacts is adjustable be equal to a pitch between two adjacent wires of the flexible flat cable.

15. The flexible flat cable testing system according to claim 1, wherein the flexible flat cable test system is adapted to be arranged on a production line of the flexible flat cable, and is configured for on-line detection of the quality of the flexible flat cable.

16. The flexible flat cable testing system according to claim 15, wherein, in response to the flexible flat cable being delivered to a test station, the first connector is moved to a first contact position with the row of first contacts electrically contacting the first ends of the row of wires and the second connector is moved to a second contact position with the row of second contacts electrically contacting the second ends of the row of wires.

17. The flexible flat cable testing system of claim 16, wherein the first connector and the second connector are moved in a transverse direction perpendicular to a conveying direction of the flexible flat cable and in a vertical direction perpendicular to the conveying direction and the transverse direction.

18. A flexible flat cable testing system, comprising:

a first connector including a row of first contacts electrically contacting a plurality of first ends of a row of wires of a flexible flat cable;

a second connector including a row of second contacts electrically contacting a plurality of second ends of the row of wires of the flexible flat cable;

a short circuit test unit including a plurality of output ports electrically connected to the row of first contacts and a plurality of input ports electrically connected to the row of second contacts; and a judgment processor configured to determine whether or not a quality of the flexible flat cable is qualified according to a potential level of each of the input ports, the judgment processor determining that the quality of the flexible flat cable is qualified if the potential level of each of the input ports is equal to a high level output by each of the output ports.

19. The flexible flat cable testing system according to claim 18, wherein:

if the potential levels of the input ports are not all the high level, the judgment processor determines that the quality of the flexible flat cable is unqualified;

if the potential level of one input port of the input ports is a low level, the judgment processor determines that a wire corresponding to the one input port in the flexible flat cable is broken and unqualified; and if the potential level of the one input port of the input ports is the high level, the judgment processor determines that the wire corresponding to the one input port in the flexible flat cable is continuous and qualified.

20. The flexible flat cable testing system according to claim 18, further comprising a potential reader for measuring the potential level of each of the input ports.

* * * * *